(12) United States Patent
Liu et al.

(10) Patent No.: US 11,757,423 B2
(45) Date of Patent: Sep. 12, 2023

(54) HIGH HARMONIC PERFORMANCE RADIO FREQUENCY FILTER

(71) Applicant: QUALCOMM Incorporated, San Diego, CA (US)

(72) Inventors: Kai Liu, Phoenix, AZ (US); Chunhu Zhang, San Diego, CA (US); Chenliang Du, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 205 days.

(21) Appl. No.: 17/353,420

(22) Filed: Jun. 21, 2021

(65) Prior Publication Data

US 2022/0406288 A1 Dec. 22, 2022

(51) Int. Cl.
| | |
|---|---|
| *H03H 7/01* | (2006.01) |
| *H03H 9/02* | (2006.01) |
| *H03H 9/64* | (2006.01) |
| *G10K 11/36* | (2006.01) |

(52) U.S. Cl.
CPC ...... *H03H 7/0161* (2013.01); *H03H 9/02007* (2013.01); *H03H 9/6406* (2013.01); *G10K 11/36* (2013.01)

(58) Field of Classification Search
CPC . H03H 9/02007; H03H 7/0161; H03H 9/6406
USPC .................................................. 333/193
See application file for complete search history.

(56) References Cited

U.S. PATENT DOCUMENTS

| | | |
|---|---|---|
| 2021/0075399 A1 | 3/2021 | Schiek et al. |
| 2021/0098319 A1 | 4/2021 | Lan et al. |

OTHER PUBLICATIONS

International Search Report and Written Opinion—PCT/US2022/072447—ISA/EPO—dated Sep. 20, 2022.

*Primary Examiner* — Rakesh B Patel
(74) *Attorney, Agent, or Firm* — Muncy, Geissler, Olds & Lowe, P.C.

(57) ABSTRACT

Disclosed is a radio frequency (RF) filter that vertically integrates an acoustic wave filter with an integrated passive device (IPD) filter. The acoustic wave filter provides selectivity at fundamental frequency band while the IPD filter provides rejection at harmonic frequency bands.

28 Claims, 9 Drawing Sheets

HIGH HARMONIC PERFORMANCE RADIO FREQUENCY FILTER

FIELD OF DISCLOSURE

This disclosure relates generally to antenna, and more specifically, but not exclusively, to a high harmonic performance radio frequency (RF) filter and fabrication techniques thereof.

BACKGROUND

Integrated circuit technology has achieved great strides in advancing computing power through miniaturization of active and passive components. The package devices can be found in many electronic devices, including processors, servers, radio frequency (RF) integrated circuits, etc. Packaging technology becomes cost-effective in high pin count devices and/or high production volume components.

Inductor-capacitor (LC)-type RF filters such as low-temperature co-fired ceramic (LTCC) and passive on glass (POG) do not have a sharp skirt (roll-off). That is, they may have relatively poor near-in-band selection capabilities. On the other hand, acoustic wave filters such as bulk acoustic wave (BAW) have sharp skirt. However, they suffer from being able to control harmonic bands (e.g., $2^{nd}$, $3^{rd}$, $4^{th}$ harmonics, etc.). In other words, they may have relatively poor out-of-band rejection capabilities.

Accordingly, there is a need for systems, apparatus, and methods that overcome the deficiencies of conventional RF filters including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary radio frequency (RF) filter is disclosed. The RF filter may comprise an acoustic wafer comprising an acoustic wave filter. The acoustic wave filter may be one of one or more acoustic filters of the acoustic wafer. The RF filter may also comprise an integrated passive device (IPD) vertically integrated with the acoustic wave filter. The IPD may comprise one or more capacitors and one or more inductors configured to form one or more passive filters including an IPD filter. The IPD filter may be any one of a low pass filter (LPF), a high pass filter (HPF), a band pass filter (BPF), or a band stop filter (BSF). The acoustic wave filter and the IPD filter may be electrically coupled to each other such that an electrical signal is filtered through both the acoustic wave filter and the IPD filter.

A method of fabricating an RF filter is disclosed. The method may comprise forming an acoustic wafer comprising an acoustic wave filter. The acoustic wave filter may be one of one or more acoustic filters of the acoustic wafer. The method may also comprise vertically integrating an integrated passive device (IPD) with the acoustic wave filter. The IPD may comprise one or more capacitors and one or more inductors configured to form one or more passive filters including an IPD filter. The IPD filter may be any one of a low pass filter (LPF), a high pass filter (HPF), a band pass filter (BPF), or a band stop filter (BSF). The acoustic wave filter and the IPD filter may be electrically coupled to each other such that an electrical signal is filtered through both the acoustic wave filter and the IPD filter.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
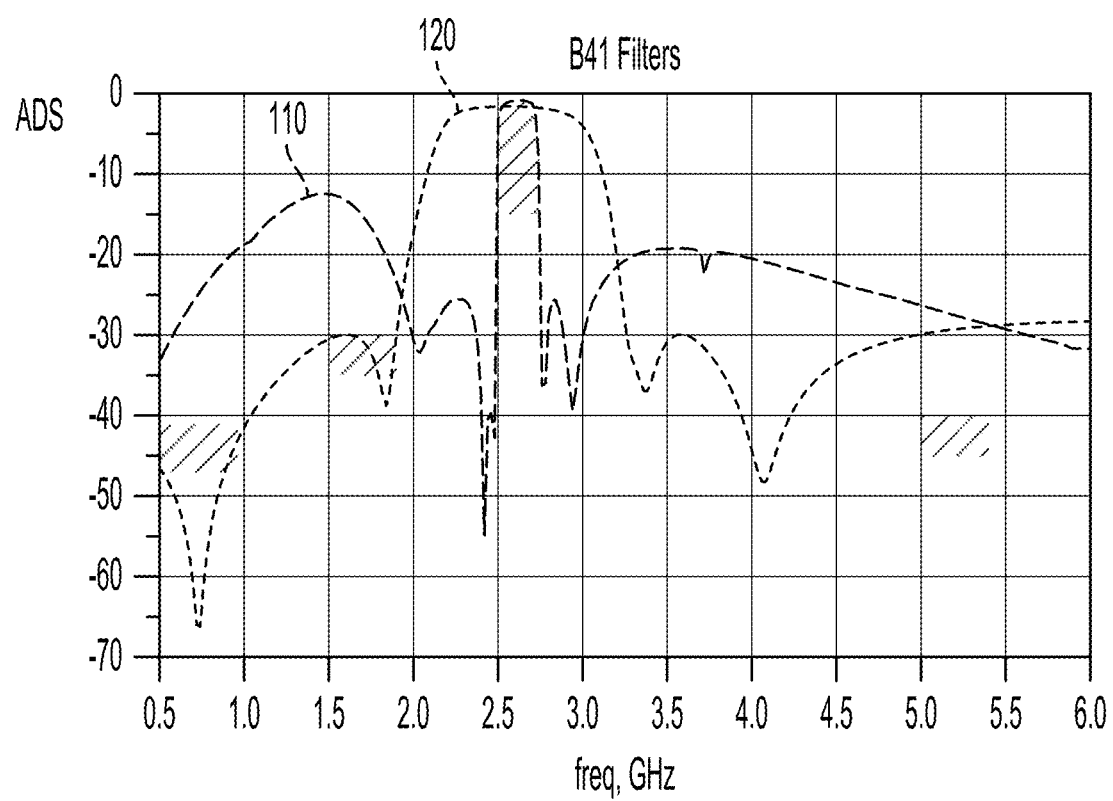
FIG. 1 is a graph of responses of bulk acoustic wave and LC-type filters for 5G B41 band.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, acoustic wave filter (e.g., surface acoustic wave (SAW), bulk acoustic wave (BAW), etc.) typically has sharper roll-off response and better band selection (with narrow band) compared to the LC-type filters (e.g., LTCC, POG, etc.). In FIG. 1, graph line 110 represents a frequency response of a BAW filter and graph line 120 represents a frequency response of an LC-type filter for 5G band B41 (between 2.496 and 2.690 GHz).

As seen, the BAW filter has very sharp roll-off at the edges of the B41 band compared to the LC-type filter. Thus, relative to the LC-type filter, the BAW filter is better at rejecting frequencies immediately lower than 2.496 GHz and immediately higher than 2.690 GHz. However, there can be some spurious responses beyond the immediate in-band areas. For example, around 1.5 GHz and 3.5 GHz, the BAW filter suffers from a bounce back. As a result, additional LPF and HPF or BPF may be needed to meet the out-of-band (OOB) rejection requirements.

If acoustic wave filters can be combined with other filters, then it can be possible to arrive at an RF filter with good performance in both near-in-band (roll-off) and harmonics (e.g., $2^{nd}$, $3^{rd}$, $4^{th}$, etc.) in terms of filter rejection, module emission control, module de-sense, sensitivity, etc. Attempts to combine have been made by adding external filters (e.g., LPF, BPF, etc.) through laminate or discrete surface mount device (SMD).

Unfortunately, such attempts to combine come with their own issues. For example, adding external filters through laminate or SMD consumes considerable space and hence increases module size, and can also lead to performance degradation. SMDs are subject to manufacturing and/or assembly variations. This can lead to coupling issues which can degrade RF performance. For example, SMD to acoustic coupling can lead to isolation degradation. Also, SMD to SMD coupling can lead to harmonics degradation. Laminate coils are also subject to high manufacturing variations. For example, the coils may vary up to 5% or even up to 10% from design during manufacturing.

Unfortunately, this can lead to significant isolation variation, harmonics notch change, impedance shift, etc. For both SMDs and laminate coils, small variations in manufacturing can lead to large variation in filter performance. In particular, out-of-band (OOB) rejection capability can be significantly impacted. In short, conventional combined filters may be very sensitive to manufacturing variations.

To address some or all issues of conventional RF filters, it is proposed to add IPD functions with acoustic filters. That is, it is proposed to combine IPD filters (e.g., LPF, HPF, BPF, BSF, etc.) with acoustic filters (SAW, BAW, etc.) through vertical integration.

The following lists technical advantages (not necessarily a complete list) of the proposed RF filter:

Adding IPD with acoustic filter adds to tighter manufacturing tolerance due to the tighter fabrication precision compared to laminate/SMD fabrication.

Bumping and redistribution layer (RDL) process (e.g., for IPD) can be implemented in existing backend (BE) or outsourced semiconductor assembly and test (OSAT) factories after acoustic wafers are completed.

Overall module performance in terms of part-to-part variation due to manufacture tolerance can be improved.

Adding IPD does not significantly increase cost since it can be absorbed in the BE process.

Adding IPD does not increase the X-Y device size due to the vertical stack-up approach.

A SAW/BAW filter is typically less than 1.5 mm×1.5 mm in size. As mentioned, these filters sometimes have harmonic issues. External filters (LPF, HPF, BPF, BSF) can be combined to control the harmonic level for module performance. Unlike laminate and SMD, integrating these external filters in IPD form can provide the combined RF filter in a same or substantially the same form factor while also providing optimum filter performance.

Figure 2:
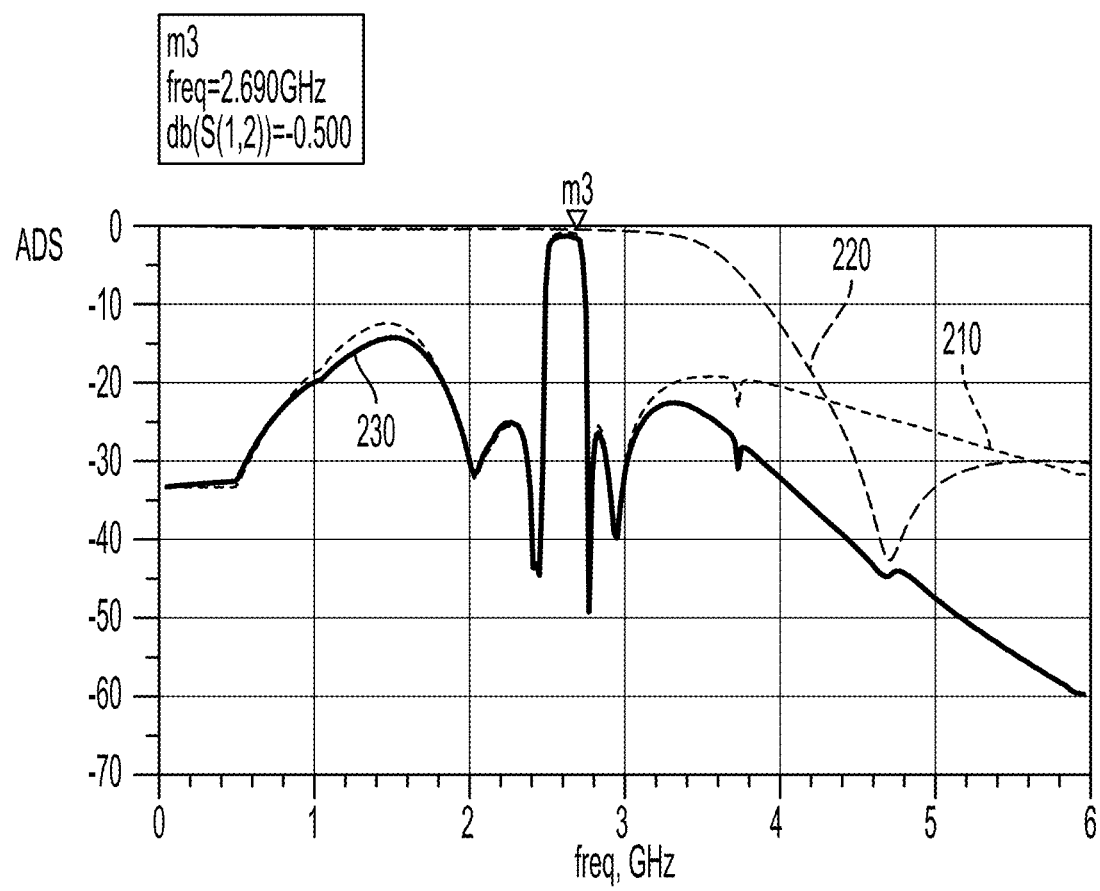
FIG. 2 is a graph of a response of an example RF filter for 5G B41 band in accordance with one or more aspects of the disclosure.

FIG. 2 is a graph of a response of an example RF filter for 5G B41 band in accordance with one or more aspects of the disclosure. In FIG. 2, graph line 210 represents a frequency response of a BAW filter, graph line 220 represents a frequency response of an IPD filter (e.g., LPF), and graph line 230 represents a cascaded frequency response of both BAW and IPD filters.

Figure 3:
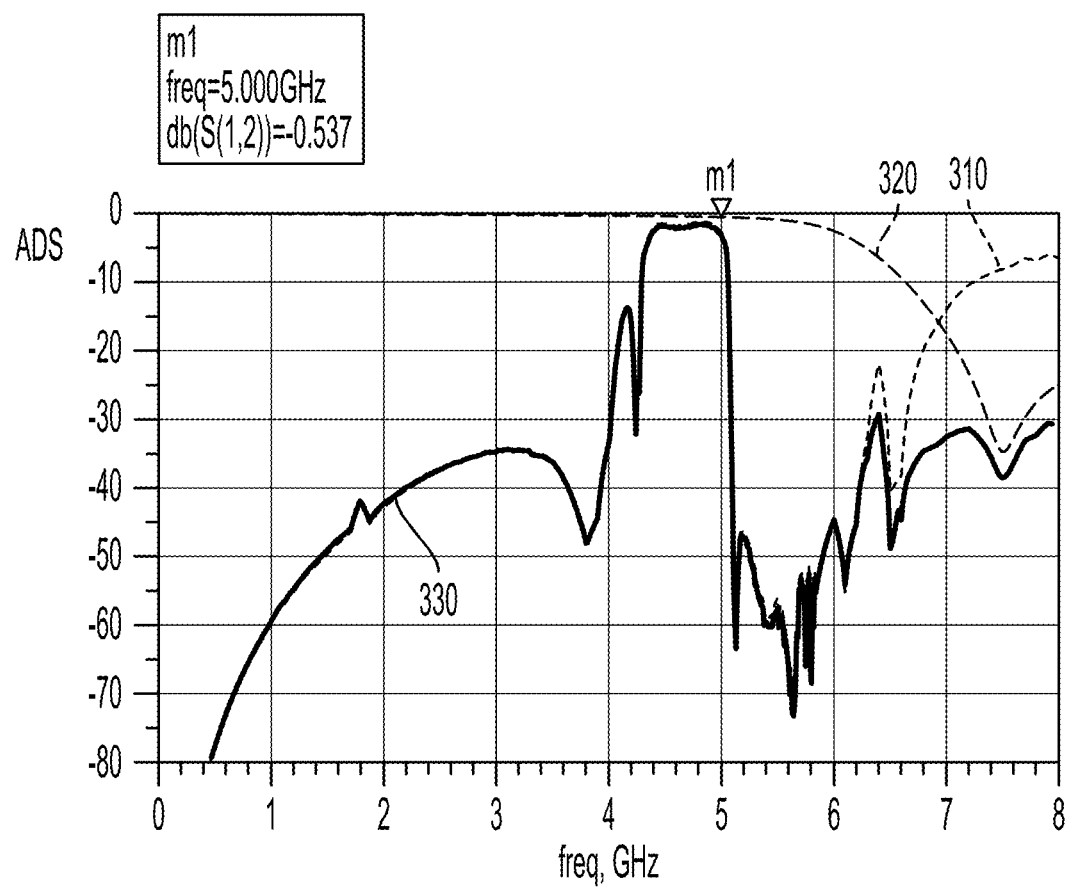
FIG. 3 is a graph of a response of an example RF filter for 5G n79 band in accordance with one or more aspects of the disclosure.

FIG. 3 is a graph of a response of an example RF filter for 5G n79 (between 4.4 and 5.0 GHz) band in accordance with one or more aspects of the disclosure. In FIG. 3, graph line 310 represents a frequency response of a BAW filter, graph line 320 represents a frequency response of an IPD filter (e.g., LPF), and graph line 330 represents a cascaded frequency response of both BAW and IPD filters.

The example RF filters of both FIGS. 2 and 3 may comprise an IPD filter vertically integrated with an acoustic wave filter (more on this below). Note that the cascaded responses show desired characteristics of RF filters including good in-band selection and good out-of-band rejection.

Figure 4A:
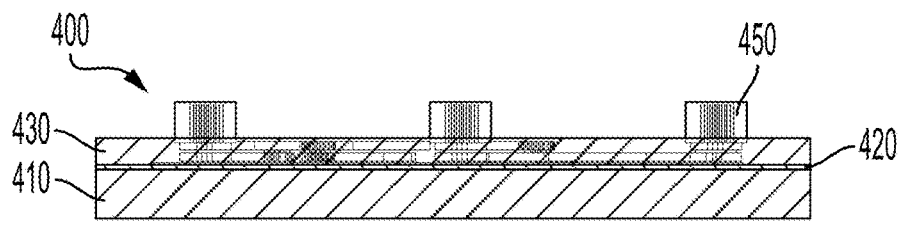
FIGS. 4A, 4B, 4C illustrate an example of an RF filter in accordance with one or more aspects of the disclosure.
Figure 4B:
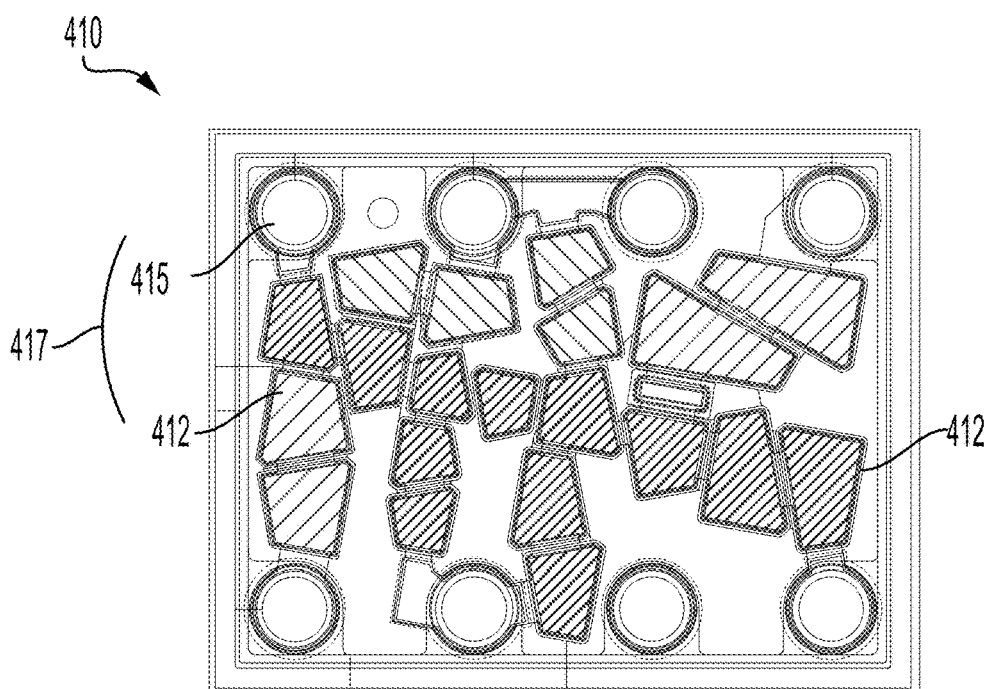
Figure 4C:
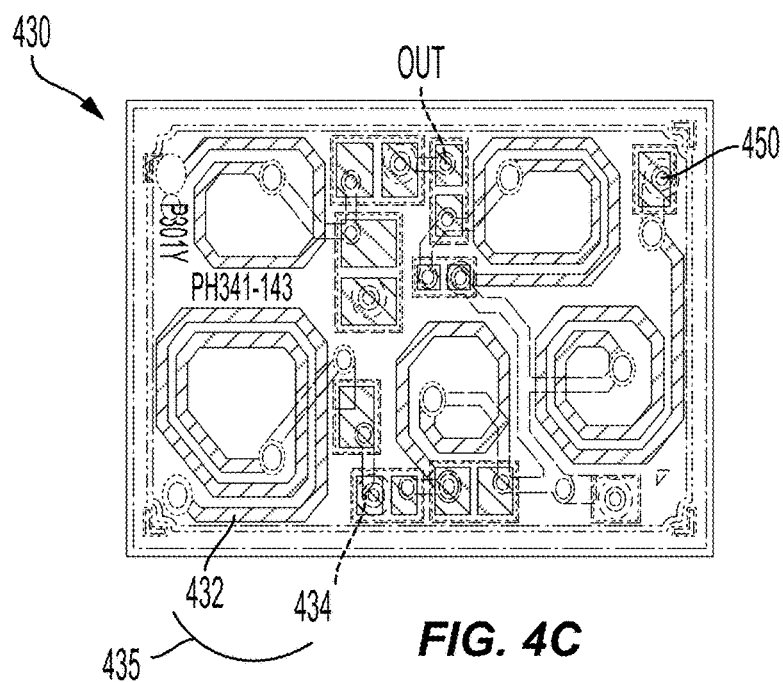

FIGS. 4A, 4B, 4C illustrate an example of an RF filter in accordance with one or more aspects of the disclosure. FIG. 4A shows a side view of an RF filter 400. As seen, the RF filter 400 may include an acoustic wafer 410 and a IPD 430 vertically integrated with the acoustic wafer 410. A passivation layer 420 may be in between the acoustic wafer 410 and a IPD 430. It should be noted that terms or phrases such as "lower", "upper", "left", "right", "below", "above", "horizontal, "vertical", etc. are used for convenience. Unless otherwise specifically indicated, such terms/phrased are not intended to indicate absolute orientations or directions.

FIG. 4B shows a top view of the acoustic wafer 410, which may comprise one or more acoustic wave filters 417. The acoustic wave filters 417 may be SAW or BAW filters. As seen, the acoustic wafer 410 may comprise one or more resonators 412 and one or more acoustic wafer pads 415. Some of the acoustic wafer pads 415 may be electromechanically coupled with the resonators 412 to form the acoustic wave filters 417. Others of the acoustic wafer pads 415 may be configured to connect with power/ground lines.

FIG. 4C shows a top view of the IPD 430, which may comprise one or more inductors 432 and one or more capacitors 434. The capacitors 434 and the inductors 434 may be configured to form one or more passive filters including an IPD filter 435. The IPD filter 435 may be an LPF, an HPF, a BPF, or a BSF. As will be seen below, the acoustic wave filter and the IPD filter 435 may be electrically coupled to each other such that an electrical signal is filtered through both the acoustic wave filter 417 and the IPD filter 435.

FIGS. 5A-5G illustrate examples stages of fabricating an RF filter in accordance with at one or more aspects of the disclosure. Broadly, acoustic wafer 410 may first be fabricated. Then, IPD process may be performed on the acoustic wafer 410.

Figure 5A:
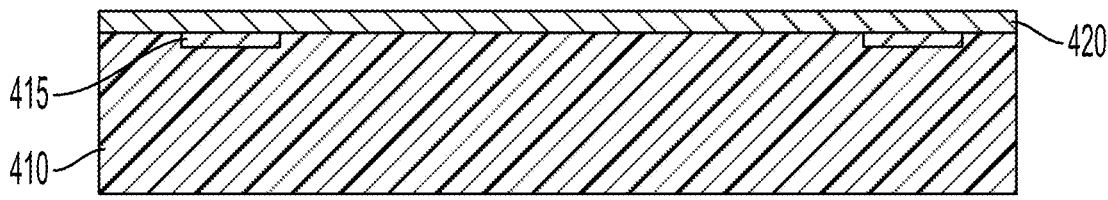
FIGS. 5A-5G illustrate examples stages of fabricating an RF filter in accordance with at one or more aspects of the disclosure.

FIG. 5A illustrates a stage in which the passivation layer 420 may be deposited on the acoustic wafer 410. Recall that the acoustic wafer 410 may comprise one or more acoustic wave filters 417 (e.g., SAW, BAW, etc.). For simplicity and for ease of explanation, resonators that make up the acoustic wave filters 417 are not illustrated. Acoustic wafer pads 415 are illustrated.

Also recall that the IPD 430 may comprise one or more capacitors 434. But again for simplicity and for ease of explanation, a single capacitor 434 will be illustrated in FIGS. 5A-5G.

Figure 5B:
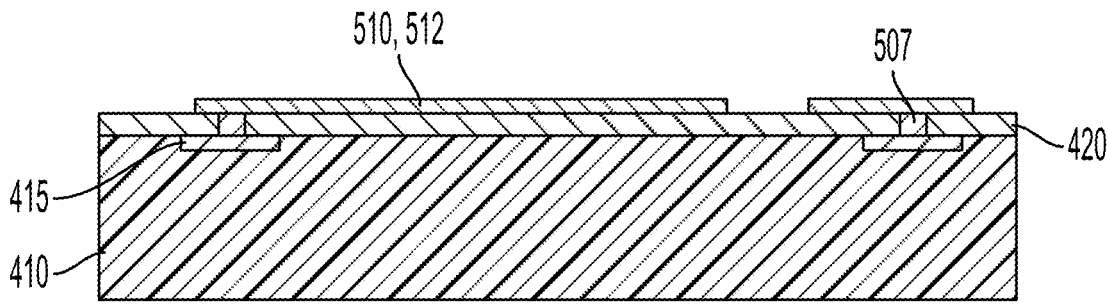

FIG. 5B illustrates a stage in which the passivation layer 420 may be patterned to form one or more passivation vias 507 in locations corresponding to the acoustic wafer pads 415 of the acoustic wafer 410. The acoustic wafer pads 415 may be exposed by the passivation vias 507. Thereafter, a first conductive layer (e.g., a metallization layer such as copper (Cu)) may be deposited on the passivation layer 420 and in the passivation vias 507 to form one or more first conductors 510. The one or more first conductors 510 formed may include a lower capacitor plate 512 of the capacitor 434. The lower capacitor plate 512 may be electrically coupled with the acoustic wafer pad 415 on the left, which will be referred to as a first acoustic wafer pad 415 for convenience. For example, the lower capacitor plate 512 may be in contact with the first acoustic wafer pad 415 through one of the passivation vias 507.

Figure 5C:
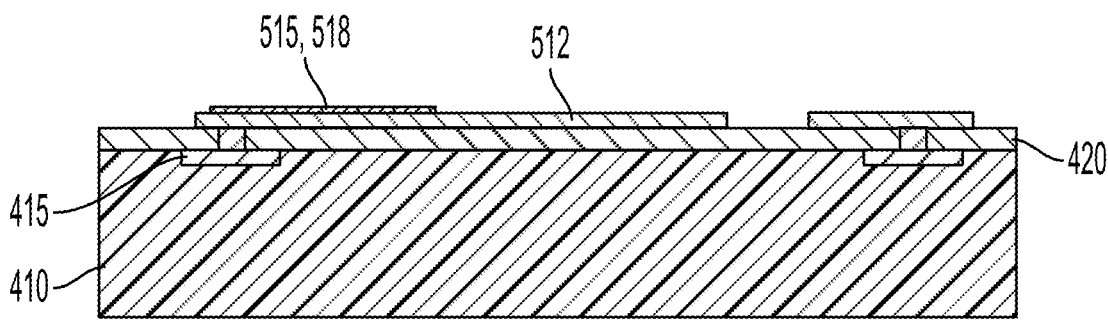

FIG. 5C illustrates a stage in which a first insulative layer 515 may be deposited and patterned to form a capacitor insulator 518 on the lower capacitor plate 512. For example, a silicon nitride (SiN) layer maybe deposited and patterned.

Figure 5D:
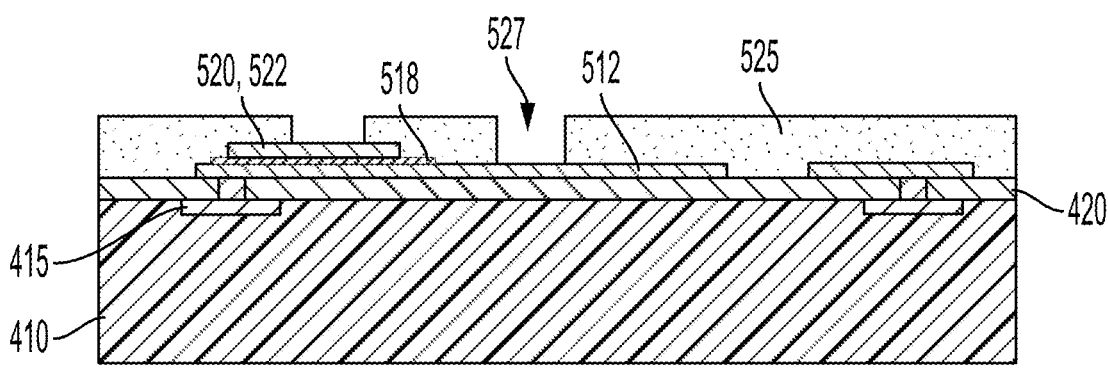

FIG. 5D illustrates a stage in which a second conductive layer (e.g., a metallization layer) may be deposited and patterned to form one or more second conductors 520. The one or more second conductors 520 may include an upper capacitor plate 522 formed on the capacitor insulator 518. The lower capacitor plate 512, the capacitor insulator 518, and the upper capacitor plate 522 may form the capacitor 434. The capacitor 434 may be a metal-insulator-metal (MIM) capacitor. The capacitor 434 may be one among one or more capacitors formed by the one or more first conductors 510, one or more capacitor insulators 518, and one or more second conductors 520.

After the upper capacitor plate 522 is formed, a second insulative layer 525 (e.g., a polyimide layer) may be deposited on the passivation layer 420, the lower capacitor plate 512, and on the upper capacitor plate 522 and patterned. The second insulative layer 525 may be patterned to form one or more second insulative vias 527 to expose portions of the lower and upper capacitor plates 512, 522.

Figure 5E:
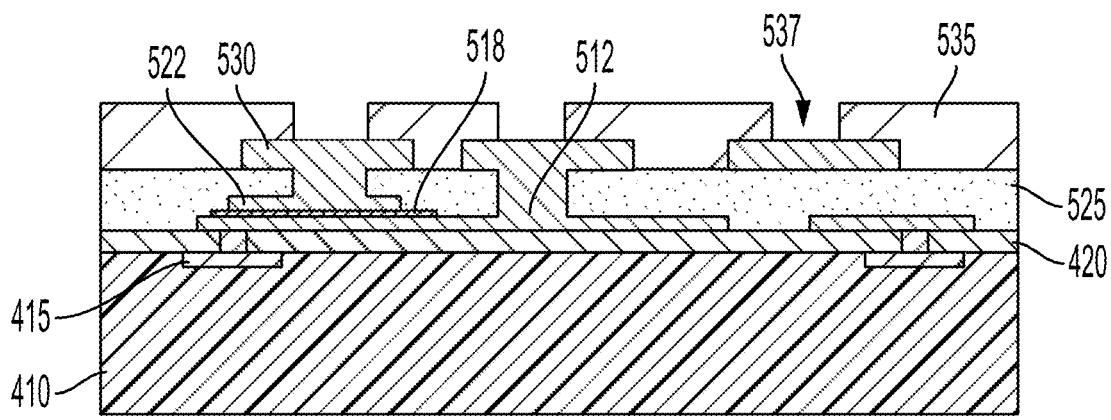

FIG. 5E illustrates a stage in which a third conductive layer (e.g., a metallization layer) may be deposited and patterned on the second insulative layer 525 and in the one or more second insulative vias 527 to form one or more third conductors 530 electrically coupled with the lower and upper capacitor plates 512, 522. After the one or more third conductors 530 are formed, a third insulative layer 535 (e.g., a polyimide layer) may be deposited on any one or more of the passivation layer 420, the one or more first conductors 510 including the lower capacitor plate 512, the capacitor insulator 526, and the one or more third conductors 530 and patterned. The third insulative layer 535 may be patterned to form one or more third insulative vias 537 to expose the one or more third conductors 530.

Figure 5F:
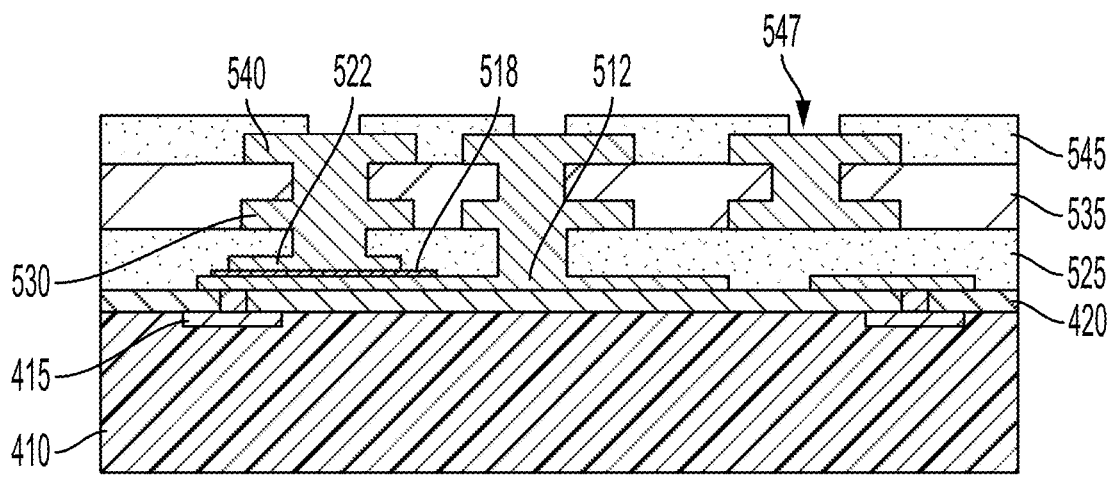

FIG. 5F illustrates a stage in which a fourth conductive layer (e.g., a metallization layer) may be deposited on the third insulative layer 535 and in the one or more third insulative vias 537 to form one or more fourth conductors 540 electrically coupled with the one or more third conductors 530. One or more third conductors 530 and one or more fourth conductors 540 may form one or more inductors 432 (not shown in FIG. 5).

After the one or more fourth conductors 540 are formed, a fourth insulative layer 545 (e.g., a polyimide layer) may be deposited on the third insulative layer 535 and/or the one or more fourth conductors 540 and patterned. The fourth insulative layer 545 may be patterned to form one or more fourth insulative vias 547 to expose the one or more fourth conductors 540.

Figure 5G:
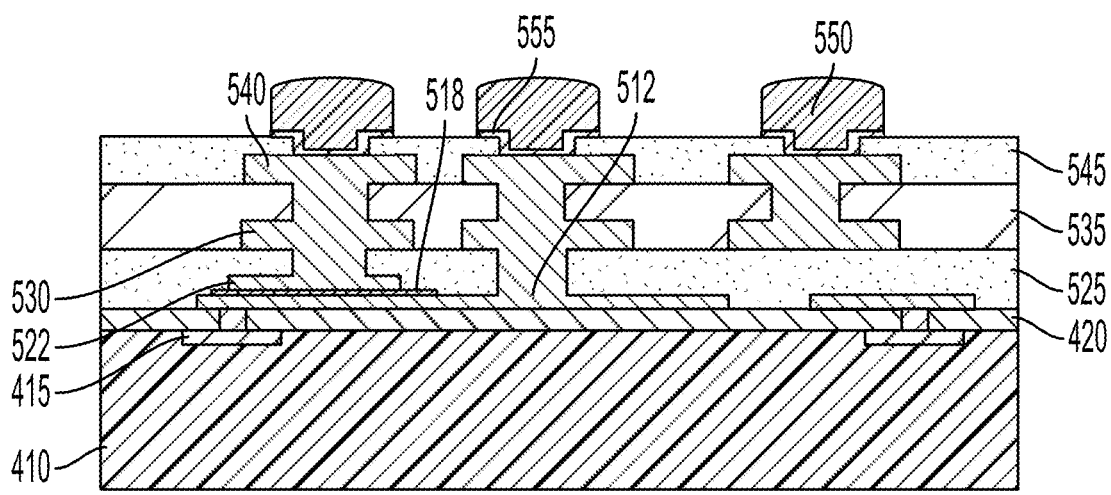

FIG. 5G illustrates a stage in which under bump metallization layers (UBM) 550 are deposited in the one or more fourth insulative vias 547. A seed layer 555 may be deposited prior to depositing the UBM 550. Thereafter, the one or more external contacts 450 may fill the one or more fourth insulative vias 547 and extend above an upper surface of the IPD 430. The one or more external contacts 450 may be formed on the fourth insulative layer 545 and in the one or more fourth insulative vias 547 to be electrically coupled with the one or more fourth conductors 540.

Figure 6:
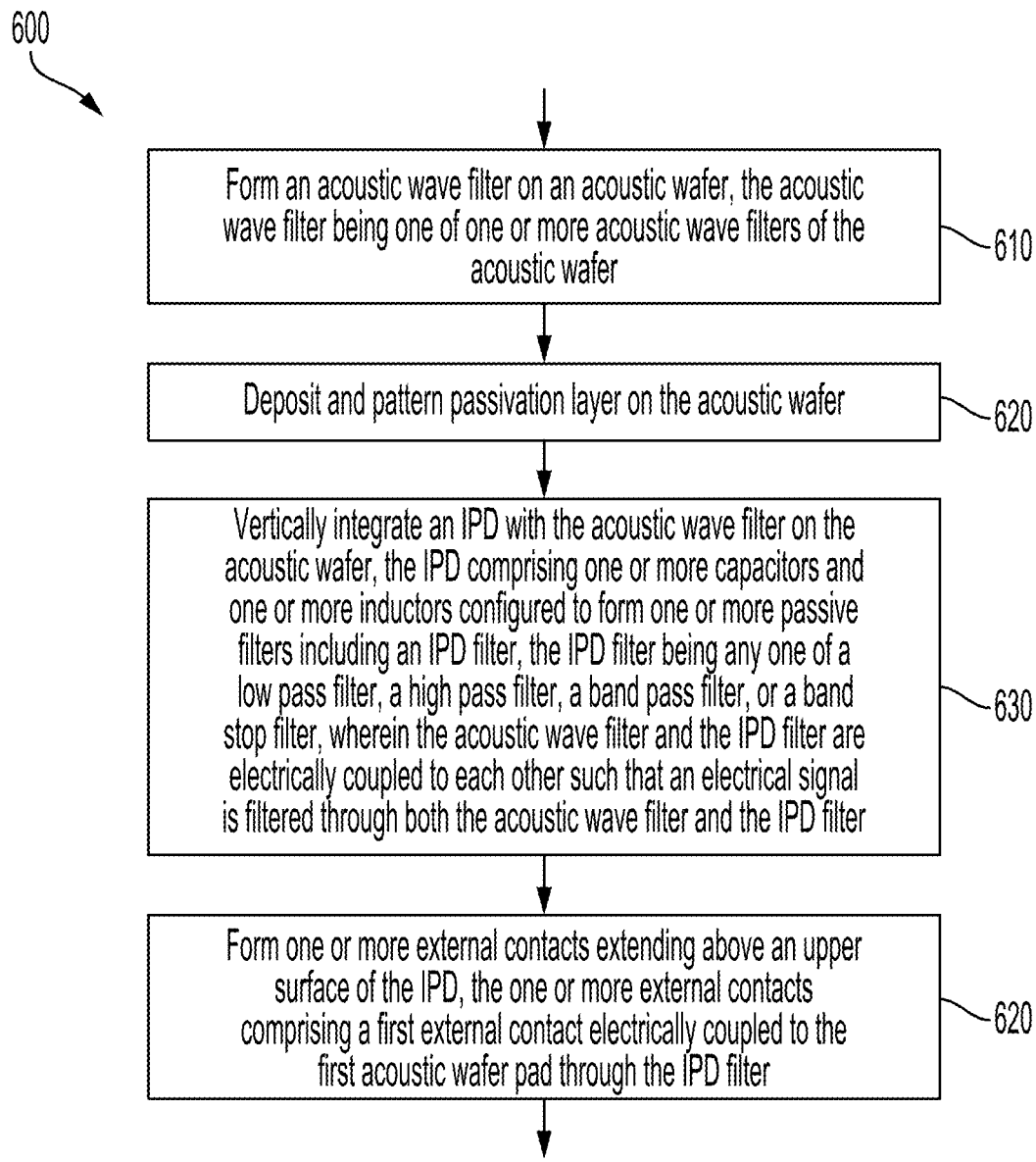
FIGS. 6-7 illustrate flow charts of an example method of manufacturing an RF filter in accordance with at one or more aspects of the disclosure.

FIG. 6 illustrates a flow chart of an example method 600 of fabricating an RF filter, such as the RF filter 100. In block 610, acoustic wafer 410 may be formed. The acoustic wafer 410 may comprise an acoustic wave filters 417, which may be one of one or more acoustic filters of the acoustic wafer 410. Each acoustic filter, including acoustic wave filter 417, may be a BAW filter or a SAW filter. Block 610 may correspond to FIG. 5A.

In block 620, a passivation layer 420 may be deposited on the acoustic wafer 410 and patterned. In doing so, one or more passivation vias corresponding to locations of one or more acoustic wafer pads 415 may be formed in the passivation layer 420. When the RF filter is fabricated, the passivation layer 420 may be between an upper surface of the acoustic wafer 410 and a lower surface of the IPD 430. Block 610 may also correspond to FIG. 5A.

In block 630, an IPD 430 may be vertically integrated with the acoustic wafer 410 including the acoustic wave filter 417. As will be shown further below, the IPD 430 may comprise one or more capacitors 434 and one or more inductors 432 configured to form one or more passive filters including an IPD filter 435. The IPD filter 435 may be an LPF, an HPF, a BPF, or a BSF. The acoustic wave filter and the IPD filter 435 may be electrically coupled to each other such that an electrical signal is filtered through both the acoustic wave filter 417 and the IPD filter 435. At least one capacitor 434 of the IPD filter 435 may be a MIM capacitor. Also, the acoustic wafer 410 and the IPD 430 may have the same or substantially the same form factor.

In an aspect, the IPD 430 comprises a plurality of conductive layers (e.g., first through fourth) and a plurality of insulative layers (e.g., first through insulative layers). The one or more capacitors 434 and the one or more inductors 432 may be formed from the plurality of conductive layers and the plurality of insulative layers. The first conductive layer may be formed on the passivation layer 420 and in the one or more passivation vias 507 to electrically couple with the one or more acoustic wafer pads 415. One or more of the plurality of conductive layers may be metallization layers (e.g., Cu). Alternatively or in addition there to, one or more the plurality of insulative layers may be polyimide layers.

Figure 7:
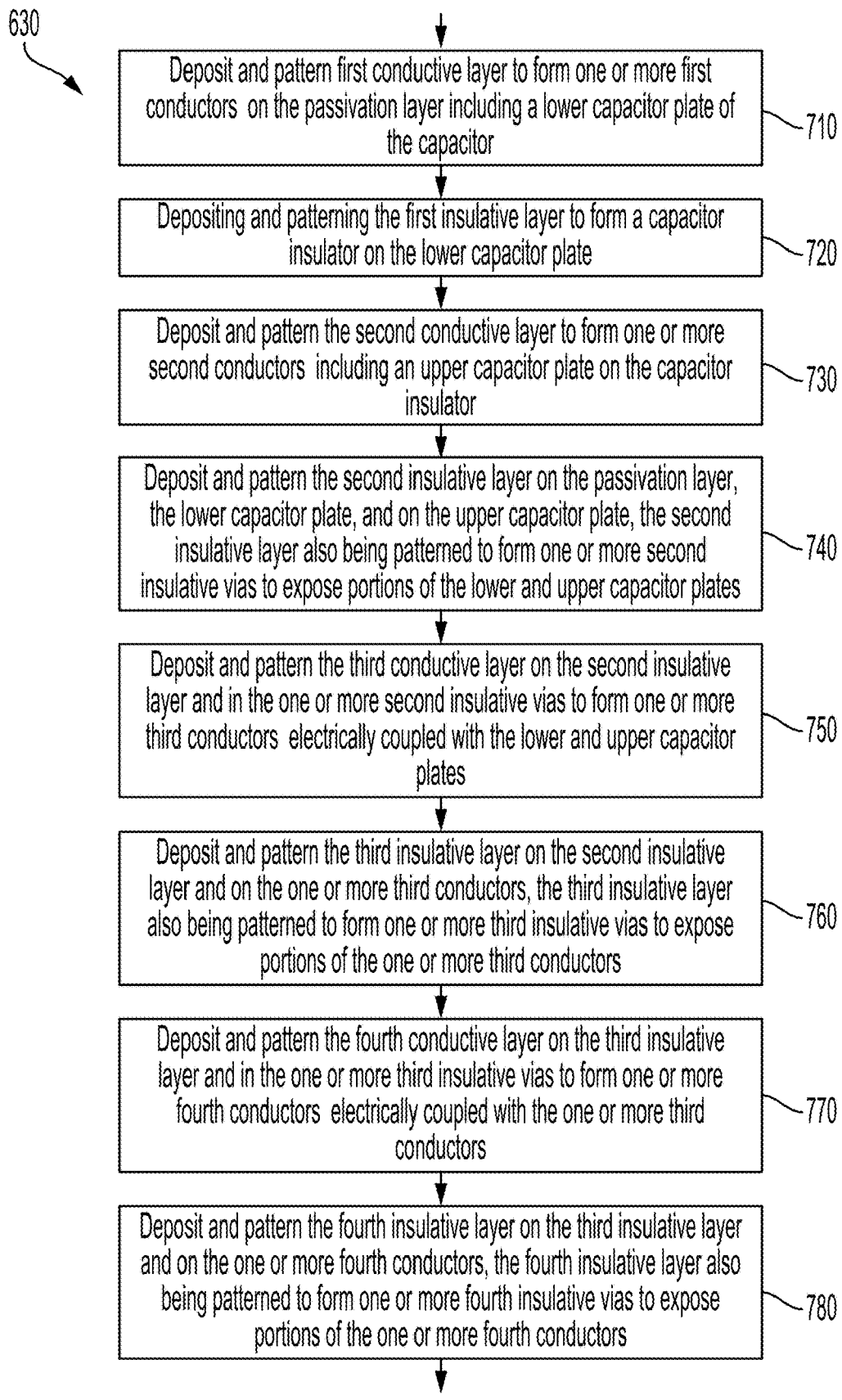

FIG. 7 illustrates a flow chart of an example process to implement block 630. In block 710, a first conductive layer may be deposited and patterned to form one or more first conductors 510 on the passivation layer 420. The one or more first conductors 510 may include a lower capacitor plate 512 of the capacitor 434 of the IPD filter 435. The lower capacitor plate 512 may be in contact with the first acoustic wafer pad 415 (acoustic wafer pad on the left). Block 710 may correspond to FIG. 5B.

In block 720, a first insulative layer 515 may be deposited and patterned to form a capacitor insulator 518 on the lower capacitor plate 512. The first insulative layer 515 may be an SiN layer. Block 720 may correspond to FIG. 5C.

In block 730, a second conductive layer may be deposited and patterned to form one or more second conductors 520. The one or more second conductors 520 may include an upper capacitor plate 522 on the capacitor insulator 518. Block 730 may correspond to FIG. 5D.

In block 740, a second insulative layer 525 may be deposited and patterned on the passivation layer 420, the lower capacitor plate 512, the capacitor insulator 518, and on the upper capacitor plate 522. The second insulative layer 525 may be patterned to form one or more second insulative vias 527 to expose portions of the lower and upper capacitor plates 512, 522. Block 740 may also correspond to FIG. 5D.

In block 750, a third conductive layer may be deposited and patterned on the second insulative layer 525 and in the one or more second insulative vias 527 to form one or more third conductors 530. The one or more third conductors 530 may be electrically coupled with the lower and upper capacitor plates 512, 522. Block 750 may correspond to FIG. 5E.

In block 760, a third insulative layer 535 may be deposited and patterned on the second insulative layer 525 and on the one or more third conductors 530. The third insulative layer 535 may be patterned to form one or more third insulative vias 537 to expose portions of the one or more third conductors 530. Block 760 may also correspond to FIG. 5E.

In block 770, a fourth conductive layer may be deposited and patterned on the third insulative layer 535 and in the one or more third insulative vials 537 to form one or more fourth conductors 540. The one or more fourth conductors 540 may be electrically coupled with the one or more third conductors 530. Block 770 may correspond to FIG. 5F.

In block 780, a fourth insulative layer 545 may be deposited and patterned on the third insulative layer 535 and on the one or more fourth conductors 540. The fourth insulative layer 545 may be patterned to form one or more fourth insulative vias 547 to expose portions of the one or more fourth conductors 540. Block 780 may also correspond to FIG. 5F.

Referring back to FIG. 6, in block 640, one or more external contacts 450 may be formed to extend above an upper surface of the IPD 430. For example, one or more UBMs 550 may line the one or more fourth insulative vias 547 and the one or more external contacts 450 may be formed on the UBMs 550. The one or more external contacts 450 may be formed on the fourth insulative layer 545 and in the one or more fourth insulative vias 547 to be electrically coupled with the one or more fourth conductors 540. Block 640 may also correspond to FIG. 5G.

Note that the conductive layers of the IPD 430 may serve as redistribution layers (RDL). This means that the external contacts 450 need not line up vertically with the wafer pads 415. For example, a center of a first external contact (external contact 450 on the left) and a center of the first acoustic wafer pad 415 need not be aligned with each other. Also, the inductor 432 may be formed from at least one third conductor 530 and at least one fourth conductor 540.

It will be appreciated that the foregoing fabrication processes and related discussion were provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the MIM capacitors and/or inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 8:
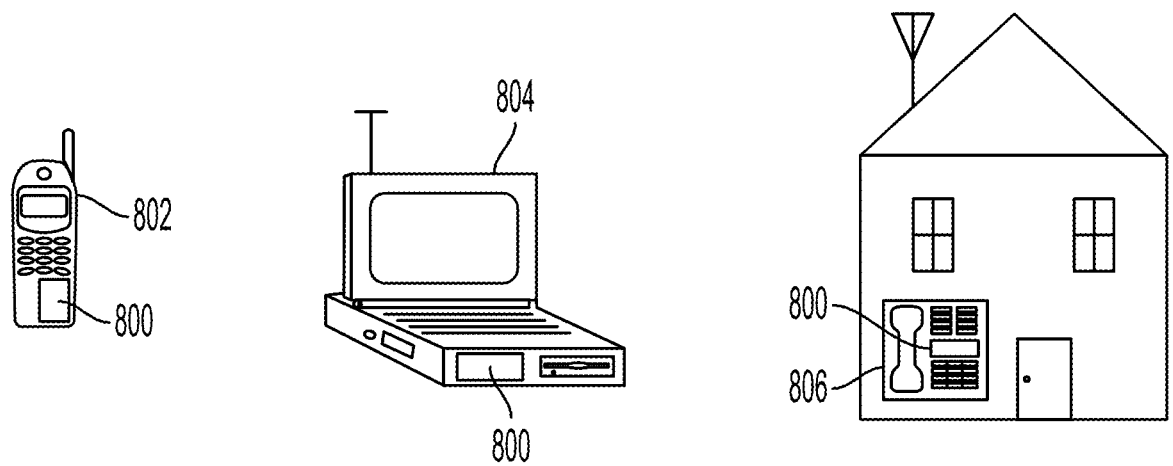
FIG. 8 illustrates various electronic devices which may utilize one or more aspects of the disclosure.

FIG. 8 illustrates various electronic devices that may be integrated with any of the aforementioned antenna on glass devices in accordance with various aspects of the disclosure. For example, a mobile phone device 802, a laptop computer device 804, and a fixed location terminal device 806 may each be considered generally user equipment (UE) and may include the RF filter as described herein. The devices 802, 804, 806 illustrated in FIG. 8 are merely exemplary. Other electronic devices may also include the RF filter including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A radio frequency (RF) filter, comprising: an acoustic wafer comprising an acoustic wave filter, the acoustic wave filter being one of one or more acoustic filters of the acoustic wafer; and an integrated passive device (IPD) vertically integrated with the acoustic wave filter, the IPD comprising one or more capacitors and one or more inductors configured to form one or more passive filters including an IPD filter, the IPD filter being any one of a low pass filter (LPF), a high pass filter (HPF), a band pass filter (BPF), or a band stop filter (BSF), wherein the acoustic wave filter and the IPD filter are electrically coupled to each other such that an electrical signal is filtered through both the acoustic wave filter and the IPD filter.

Clause 2: The RF filter of clause 1, wherein at least one capacitor is a metal-insulator-metal (MIM) capacitor.

Clause 3: The RF filter of any of clauses 1-2, wherein form factors of the acoustic wafer and the IPD are substantially the same.

Clause 4: The RF filter of any of clauses 1-3, wherein the acoustic wave filter is a bulk acoustic wave (BAW) filter.

Clause 5: The RF filter of any of clauses 1-3, wherein the acoustic wave filter is a surface acoustic wave (SAW) filter.

Clause 6: The RF filter of any of clauses 1-5, wherein the acoustic wafer comprises one or more acoustic wafer pads formed within the acoustic wafer, the one or more acoustic wafer pads being electromechanically coupled to one or more resonators of the acoustic wave filter, and wherein the one or more acoustic wafer pads comprise a first acoustic wafer pad through which the acoustic wave filter and the IPD filter are electrically coupled to each other.

Clause 7: The RF filter of clause 6, further comprising: one or more external contacts extending above an upper surface of the IPD, the one or more external contacts comprising a first external contact electrically coupled to the first acoustic wafer pad through the IPD filter.

Clause 8: The RF filter of clause 7, wherein a center of the first external contact and a center of the first acoustic wafer pad are not aligned with each other.

Clause 9: The RF filter of any of clauses 7-8, further comprising: a passivation layer between an upper surface of the acoustic wafer and a lower surface of the IPD.

Clause 10: The RF filter of clause 9, wherein one or more passivation vias corresponding to locations of the one or more acoustic wafer pads are formed in the passivation layer, wherein the IPD comprises a plurality of conductive layers and a plurality of insulative layers, the one or more capacitors and the one or more inductors of the IPD filter being formed from the plurality of conductive layers and the plurality of insulative layers, and wherein the plurality of conductive layers includes a first conductive layer formed on the passivation layer and in the one or more passivation vias to electrically couple with the one or more acoustic wafer pads.

Clause 11: The RF filter of clause 10, wherein one or more of the plurality of conductive layers are metallization layers, or wherein one or more the plurality of insulative layers are polyimide layers, or both.

Clause 12: The RF filter of any of clauses 10-11, wherein the plurality of conductive layers further comprises second, third, and fourth conductive layers, wherein the plurality of insulative layers comprises first, second, third, and fourth insulative layers, wherein the first conductive layer is deposited and patterned to form one or more first conductors on the passivation layer including a lower capacitor plate of at least one capacitor, wherein the first insulative layer is deposited and patterned to form a capacitor insulator on the lower capacitor plate, wherein the second conductive layer is deposited and patterned to form one or more second conductors including an upper capacitor plate on the capacitor insulator, wherein the second insulative layer is deposited and patterned on the passivation layer, the lower capacitor plate, and on the upper capacitor plate, the second insulative layer also being patterned to form one or more second insulative vias to expose portions of the lower and upper capacitor plates, wherein the third conductive layer is deposited and patterned on the second insulative layer and in the one or more second insulative vias to form one or more third conductors electrically coupled with the lower and upper capacitor plates, wherein the third insulative layer is deposited and patterned on the second insulative layer and on the one or more third conductors, the third insulative layer also being patterned to form one or more third insulative vias to expose portions of the one or more third conductors, wherein the fourth conductive layer is deposited and patterned on the third insulative layer and in the one or more third insulative vias to form one or more fourth conductors electrically coupled with the one or more third conductors, wherein the fourth insulative layer is deposited and patterned on the third insulative layer and on the one or more fourth conductors, the fourth insulative layer also being patterned to form one or more fourth insulative vias to expose portions of the one or more fourth conductors, and wherein the one or more external contacts are formed on the fourth insulative layer and in the one or more fourth insulative vias to be electrically coupled with the one or more fourth conductors.

Clause 13: The RF filter of clause 12, wherein the lower capacitor plate is in contact with the first acoustic wafer pad.

Clause 14: The RF filter of any of clauses 12-13, wherein the capacitor insulator is formed from silicon nitride.

Clause 15: The RF filter of any of clauses 12-14, wherein the inductor is formed from at least one third conductor and at least one fourth conductor.

Clause 16: The RF filter of any of clauses 1-15, wherein the RF filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 17: A method of fabricating a radio frequency (RF) filter, comprising: forming an acoustic wafer comprising an acoustic wave filter, the acoustic wave filter being one of one or more acoustic filters of the acoustic wafer; and vertically integrating an integrated passive device (IPD) with the acoustic wave filter, the IPD comprising one or more capacitors and one or more inductors configured to form one or more passive filters including an IPD filter, the IPD filter being any one of a low pass filter (LPF), a high pass filter (HPF), a band pass filter (BPF), or a band stop filter (BSF), wherein the acoustic wafer and the IPD filter are electrically coupled to each other such that an electrical signal is filtered through both the acoustic wafer and the IPD filter.

Clause 18: The method of clause 17, wherein at least one capacitor is a metal-insulator-metal (MIM) capacitor.

Clause 19: The method of any of clauses 17-18, wherein form factors of the acoustic wafer and the IPD are substantially the same.

Clause 20: The method of any of clauses 17-19, wherein the acoustic wave filter is a bulk acoustic wave (BAW) filter.

Clause 21: The method of any of clauses 17-19, wherein the acoustic wave filter is a surface acoustic wave (SAW) filter.

Clause 22: The method of any of clauses 17-21, wherein the acoustic wafer comprises one or more acoustic wafer pads formed within the acoustic wafer, the one or more acoustic wafer pads being electromechanically coupled to one or more resonators of the acoustic wave filter, and wherein the one or more acoustic wafer pads comprise a first acoustic wafer pad through which the acoustic wave filter and the IPD filter are electrically coupled to each other.

Clause 23: The method of clause 22, further comprising: forming one or more external contacts extending above an upper surface of the IPD, the one or more external contacts comprising a first external contact electrically coupled to the first acoustic wafer pad through the IPD filter.

Clause 24: The method of clause 23, wherein a center of the first external contact and a center of the first acoustic wafer pad are not aligned with each other.

Clause 25: The method of any of clauses 23-24, further comprising: depositing and patterning a passivation layer between an upper surface of the acoustic wafer and a lower surface of the IPD.

Clause 26: The method of clause 25, wherein one or more passivation vias corresponding to locations of the one or more acoustic wafer pads are formed in the passivation layer, wherein the IPD comprises a plurality of conductive layers and a plurality of insulative layers, the one or more capacitors and the one or more inductors of the IPD filter being formed from the plurality of conductive layers and the plurality of insulative layers, and wherein the plurality of conductive layers includes a first conductive layer formed on the passivation layer and in the one or more passivation vias to electrically couple with the one or more acoustic wafer pads.

Clause 27: The method of clause 26, wherein one or more of the plurality of conductive layers are metallization layers, or wherein one or more the plurality of insulative layers are polyimide layers, or both.

Clause 28: The method of any of clauses 26-27, wherein the plurality of conductive layers further comprises second, third, and fourth conductive layers, wherein the plurality of insulative layers comprises first, second, third, and fourth insulative layers, wherein vertically integrating the IPD with the acoustic wave filter comprises: depositing and patterning the first conductive layer to form one or more first conductors on the passivation layer including a lower capacitor plate of at least one capacitor; depositing and patterning the first insulative layer to form a capacitor insulator on the lower capacitor plate; depositing and patterning the second conductive layer to form one or more second conductors including an upper capacitor plate on the capacitor insulator; depositing and patterning the second insulative layer on the passivation layer, the lower capacitor plate, and on the upper capacitor plate, the second insulative layer also being patterned to form one or more second insulative vias to expose portions of the lower and upper capacitor plates; depositing and patterning the third conductive layer on the second insulative layer and in the one or more second insulative vias to form one or more third conductors electrically coupled with the lower and upper capacitor plates; depositing and patterning the third insulative layer on the second insulative layer and on the one or more third conductors, the third insulative layer also being patterned to form one or more third insulative vias to expose portions of the one or more third conductors; depositing and patterning the fourth conductive layer on the third insulative layer and in the one or more third insulative vias to form one or more fourth conductors electrically coupled with the one or more third conductors; and depositing and patterning the fourth insulative layer on the third insulative layer and on the one or more fourth conductors, the fourth insulative layer also being patterned to form one or more fourth insulative vias to expose portions of the one or more fourth conductors, and wherein the one or more external contacts are formed on the fourth insulative layer and in the one or more fourth insulative vias to be electrically coupled with the one or more fourth conductors.

Clause 29: The method of clause 28, wherein the lower capacitor plate is in contact with the first acoustic wafer pad.

Clause 30: The method of any of clauses 28-29, wherein the capacitor insulator is formed from silicon nitride.

Clause 31: The method of any of clauses 28-30, wherein the inductor is formed from at least one third conductor and at least one fourth conductor.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A radio frequency (RF) filter, comprising:
    an acoustic wafer comprising an acoustic wave filter, the acoustic wave filter being one of one or more acoustic filters of the acoustic wafer; and
    an integrated passive device (IPD) vertically integrated with the acoustic wave filter, the IPD comprising one or more capacitors and one or more inductors configured to form one or more passive filters including an IPD filter, the IPD filter being any one of a low pass filter (LPF), a high pass filter (HPF), a band pass filter (BPF), or a band stop filter (BSF),
    wherein the acoustic wave filter and the IPD filter are electrically coupled to each other such that an electrical signal is filtered through both the acoustic wave filter and the IPD filter,
    wherein the acoustic wafer comprises one or more acoustic wafer pads formed within the acoustic wafer, the one or more acoustic wafer pads being electromechanically coupled to one or more resonators of the acoustic wave filter, and
    wherein the one or more acoustic wafer pads comprise a first acoustic wafer pad through which the acoustic wave filter and the IPD filter are electrically coupled to each other.

2. The RF filter of claim 1, wherein at least one capacitor is a metal-insulator-metal (MIM) capacitor.

3. The RF filter of claim 1, wherein form factors of the acoustic wafer and the IPD are substantially the same.

4. The RF filter of claim 1, wherein the acoustic wave filter is a bulk acoustic wave (BAW) filter.

5. The RF filter of claim 1, wherein the acoustic wave filter is a surface acoustic wave (SAW) filter.

6. The RF filter of claim 1, wherein the RF filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, and a device in an automotive vehicle.

7. The RF filter of claim 1, further comprising:
one or more external contacts extending above an upper surface of the IPD, the one or more external contacts comprising a first external contact electrically coupled to the first acoustic wafer pad through the IPD filter.

8. The RF filter of claim 7, wherein a center of the first external contact and a center of the first acoustic wafer pad are not aligned with each other.

9. The RF filter of claim 7, further comprising:
a passivation layer between an upper surface of the acoustic wafer and a lower surface of the IPD.

10. The RF filter of claim 9,
wherein one or more passivation vias corresponding to locations of the one or more acoustic wafer pads are formed in the passivation layer,
wherein the IPD comprises a plurality of conductive layers and a plurality of insulative layers, the one or more capacitors and the one or more inductors of the IPD filter being formed from the plurality of conductive layers and the plurality of insulative layers, and
wherein the plurality of conductive layers includes a first conductive layer formed on the passivation layer and in the one or more passivation vias to electrically couple with the one or more acoustic wafer pads.

11. The RF filter of claim 10,
wherein one or more of the plurality of conductive layers are metallization layers, or
wherein one or more the plurality of insulative layers are polyimide layers, or both.

12. The RF filter of claim 10,
wherein the plurality of conductive layers further comprises second, third, and fourth conductive layers,
wherein the plurality of insulative layers comprises first, second, third, and fourth insulative layers,
wherein the first conductive layer is deposited and patterned to form one or more first conductors on the passivation layer including a lower capacitor plate of at least one capacitor,
wherein the first insulative layer is deposited and patterned to form a capacitor insulator on the lower capacitor plate,
wherein the second conductive layer is deposited and patterned to form one or more second conductors including an upper capacitor plate on the capacitor insulator,
wherein the second insulative layer is deposited and patterned on the passivation layer, the lower capacitor plate, and on the upper capacitor plate, the second insulative layer also being patterned to form one or more second insulative vias to expose portions of the lower and upper capacitor plates,
wherein the third conductive layer is deposited and patterned on the second insulative layer and in the one or more second insulative vias to form one or more third conductors electrically coupled with the lower and upper capacitor plates,
wherein the third insulative layer is deposited and patterned on the second insulative layer and on the one or more third conductors, the third insulative layer also being patterned to form one or more third insulative vias to expose portions of the one or more third conductors,
wherein the fourth conductive layer is deposited and patterned on the third insulative layer and in the one or more third insulative vias to form one or more fourth conductors electrically coupled with the one or more third conductors,
wherein the fourth insulative layer is deposited and patterned on the third insulative layer and on the one or more fourth conductors, the fourth insulative layer also being patterned to form one or more fourth insulative vias to expose portions of the one or more fourth conductors, and
wherein the one or more external contacts are formed on the fourth insulative layer and in the one or more fourth insulative vias to be electrically coupled with the one or more fourth conductors.

13. The RF filter of claim 12, wherein the lower capacitor plate is in contact with the first acoustic wafer pad.

14. The RF filter of claim 12, wherein the capacitor insulator is formed from silicon nitride.

15. The RF filter of claim 12, wherein at least one inductor is formed from at least one third conductor and at least one fourth conductor.

16. A method of fabricating a radio frequency (RF) filter, the method comprising:
forming an acoustic wafer comprising an acoustic wave filter, the acoustic wave filter being one of one or more acoustic filters of the acoustic wafer; and
vertically integrating an integrated passive device (IPD) with the acoustic wave filter, the IPD comprising one or more capacitors and one or more inductors configured to form one or more passive filters including an IPD filter, the IPD filter being any one of a low pass filter (LPF), a high pass filter (HPF), a band pass filter (BPF), or a band stop filter (BSF),
wherein the acoustic wafer and the IPD filter are electrically coupled to each other such that an electrical signal is filtered through both the acoustic wafer and the IPD filter,
wherein the acoustic wafer comprises one or more acoustic wafer pads formed within the acoustic wafer, the one or more acoustic wafer pads being electromechanically coupled to one or more resonators of the acoustic wave filter, and
wherein the one or more acoustic wafer pads comprise a first acoustic wafer pad through which the acoustic wave filter and the IPD filter are electrically coupled to each other.

17. The method of claim 16, wherein the acoustic wave filter is a surface acoustic wave (SAW) filter.

18. The method of claim 16, wherein at least one capacitor is a metal-insulator-metal (MIM) capacitor.

19. The method of claim 16, wherein form factors of the acoustic wafer and the IPD are substantially the same.

20. The method of claim 16, wherein the acoustic wave filter is a bulk acoustic wave (BAW) filter.

21. The method of claim 16, further comprising:
forming one or more external contacts extending above an upper surface of the IPD, the one or more external contacts comprising a first external contact electrically coupled to the first acoustic wafer pad through the IPD filter.

22. The method of claim 21, wherein a center of the first external contact and a center of the first acoustic wafer pad are not aligned with each other.

23. The method of claim 21, further comprising:
depositing and patterning a passivation layer between an upper surface of the acoustic wafer and a lower surface of the IPD.

24. The method of claim 23,
wherein one or more passivation vias corresponding to locations of the one or more acoustic wafer pads are formed in the passivation layer,
wherein the IPD comprises a plurality of conductive layers and a plurality of insulative layers, the one or more capacitors and the one or more inductors of the IPD filter being formed from the plurality of conductive layers and the plurality of insulative layers, and
wherein the plurality of conductive layers includes a first conductive layer formed on the passivation layer and in the one or more passivation vias to electrically couple with the one or more acoustic wafer pads.

25. The method of claim 24,
wherein one or more of the plurality of conductive layers are metallization layers, or
wherein one or more the plurality of insulative layers are polyimide layers, or both.

26. The method of claim 24,
wherein the plurality of conductive layers further comprises second, third, and fourth conductive layers,
wherein the plurality of insulative layers comprises first, second, third, and fourth insulative layers,
wherein vertically integrating the IPD with the acoustic wave filter comprises:
depositing and patterning the first conductive layer to form one or more first conductors on the passivation layer including a lower capacitor plate of at least one capacitor;
depositing and patterning the first insulative layer to form a capacitor insulator on the lower capacitor plate;
depositing and patterning the second conductive layer to form one or more second conductors including an upper capacitor plate on the capacitor insulator;
depositing and patterning the second insulative layer on the passivation layer, the lower capacitor plate, and on the upper capacitor plate, the second insulative layer also being patterned to form one or more second insulative vias to expose portions of the lower and upper capacitor plates;
depositing and patterning the third conductive layer on the second insulative layer and in the one or more second insulative vias to form one or more third conductors electrically coupled with the lower and upper capacitor plates,
depositing and patterning the third insulative layer on the second insulative layer and on the one or more third conductors, the third insulative layer also being patterned to form one or more third insulative vias to expose portions of the one or more third conductors;
depositing and patterning the fourth conductive layer on the third insulative layer and in the one or more third insulative vias to form one or more fourth conductors electrically coupled with the one or more third conductors; and
depositing and patterning the fourth insulative layer on the third insulative layer and on the one or more fourth conductors, the fourth insulative layer also being patterned to form one or more fourth insulative vias to expose portions of the one or more fourth conductors, and
wherein the one or more external contacts are formed on the fourth insulative layer and in the one or more fourth insulative vias to be electrically coupled with the one or more fourth conductors.

27. The method of claim 26, wherein the lower capacitor plate is in contact with the first acoustic wafer pad.

28. The method of claim 26, wherein at least one inductor is formed from at least one third conductor and at least one fourth conductor.

* * * * *